(12) United States Patent
Doumae et al.

(10) Patent No.: US 7,911,821 B2
(45) Date of Patent: Mar. 22, 2011

(54) SEMICONDUCTOR MEMORY DEVICE

(75) Inventors: Sumiko Doumae, Kanagawa-ken (JP); Daisaburo Takashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 12/505,820

(22) Filed: Jul. 20, 2009

(65) Prior Publication Data
US 2010/0020587 A1 Jan. 28, 2010

(30) Foreign Application Priority Data
Jul. 24, 2008 (JP) .................. 2008-191055

(51) Int. Cl.
*G11C 11/22* (2006.01)

(52) U.S. Cl. .............. 365/145; 365/189.07; 365/189.09; 365/222

(58) Field of Classification Search .................. 365/145, 365/189.07, 189.09, 222
See application file for complete search history.

(56) References Cited

U.S. PATENT DOCUMENTS
6,707,736 B2  3/2004  Miyakawa et al.
7,375,998 B2 *  5/2008  Yang .............................. 365/145

FOREIGN PATENT DOCUMENTS
JP  2005-242570  9/2005
* cited by examiner

*Primary Examiner* — David Lam
(74) *Attorney, Agent, or Firm* — Oblon, Spivak, McClelland, Maier & Neustadt, L.L.P.

(57) ABSTRACT

A ferroelectric memory is provided with a voltage generating circuit configured to generate prescribed driving potential, a driving interconnection to which the driving potential is applied, a plurality of memory cells connected to the driving interconnections and an internal voltage comparison circuit configured to compare inputted potential and to output results thereof. A plurality of voltage monitoring interconnections are provided to connect between a portion of the driving interconnection disposed at a position distant from the voltage generating circuit on the substrate and the internal voltage comparison circuit. The internal voltage comparison circuit compares potential inputted through the voltage monitoring interconnection with the driving potential.

20 Claims, 6 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2008-191055, filed on Jul. 24, 2008; the entire contents of which are incorporated herein by reference.

BACKGROUND OF THE INVENTION

1. Field of the Invention

This invention relates to a semiconductor memory device provided with a plurality of memory cells on one substrate.

2. Background Art

A semiconductor device is generally configured to include a plurality of memory cells on a substrate. The semiconductor memory device like this suffers from elongation of time required for evaluation of characteristics and analysis of causes of failure associated with enlargement of capacity. Particularly, it is difficult to determine whether a test condition is enough severe to evaluate a weak point reliably with respect to a semiconductor memory device with large capacity. Thereby, it is necessary to cover various test conditions, and thus a great deal of time and labor are required (for example, JP-A 2005-242570 (Kokai)).

SUMMARY OF THE INVENTION

According to an aspect of the invention, there is provided a semiconductor memory device including: a substrate; a voltage generating circuit provided on the substrate and configured to generate prescribed driving potential; a driving interconnection provided on the substrate and to which the driving potential is applied; a plurality of memory cells connected to the driving interconnections; an internal voltage comparison circuit configured to compare inputted potentials and to output results thereof; and a voltage monitoring interconnection connected between a portion of the driving interconnection disposed at a position distant from the voltage generating circuit on the substrate and the internal voltage comparison circuit, the internal voltage comparison circuit comparing potential inputted through the voltage monitoring interconnection with the driving potential.

DETAILED DESCRIPTION OF THE INVENTION

Embodiments of the invention will now be described with reference to the drawings.

First, a first embodiment of the invention is described.

Figure 1:
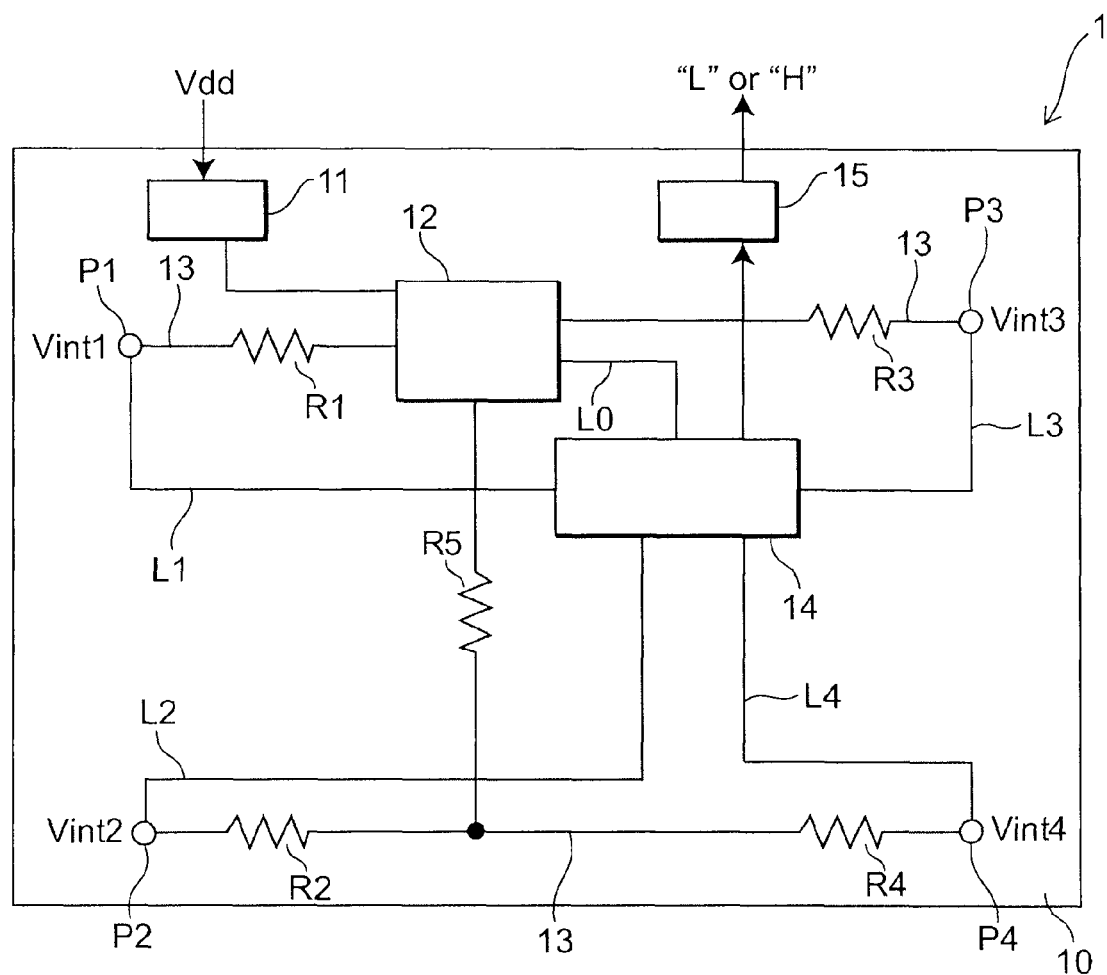
FIG. 1 is a schematic plan view illustrating a semiconductor memory device according to a first embodiment of the invention.
Figure 2:
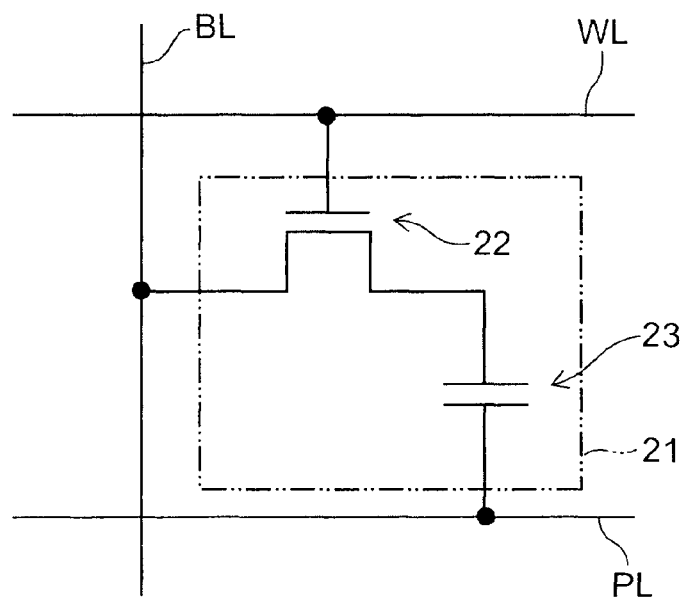
FIG. 2 is a circuit diagram illustrating a memory cell of the semiconductor memory device according to the first embodiment.
Figure 3:
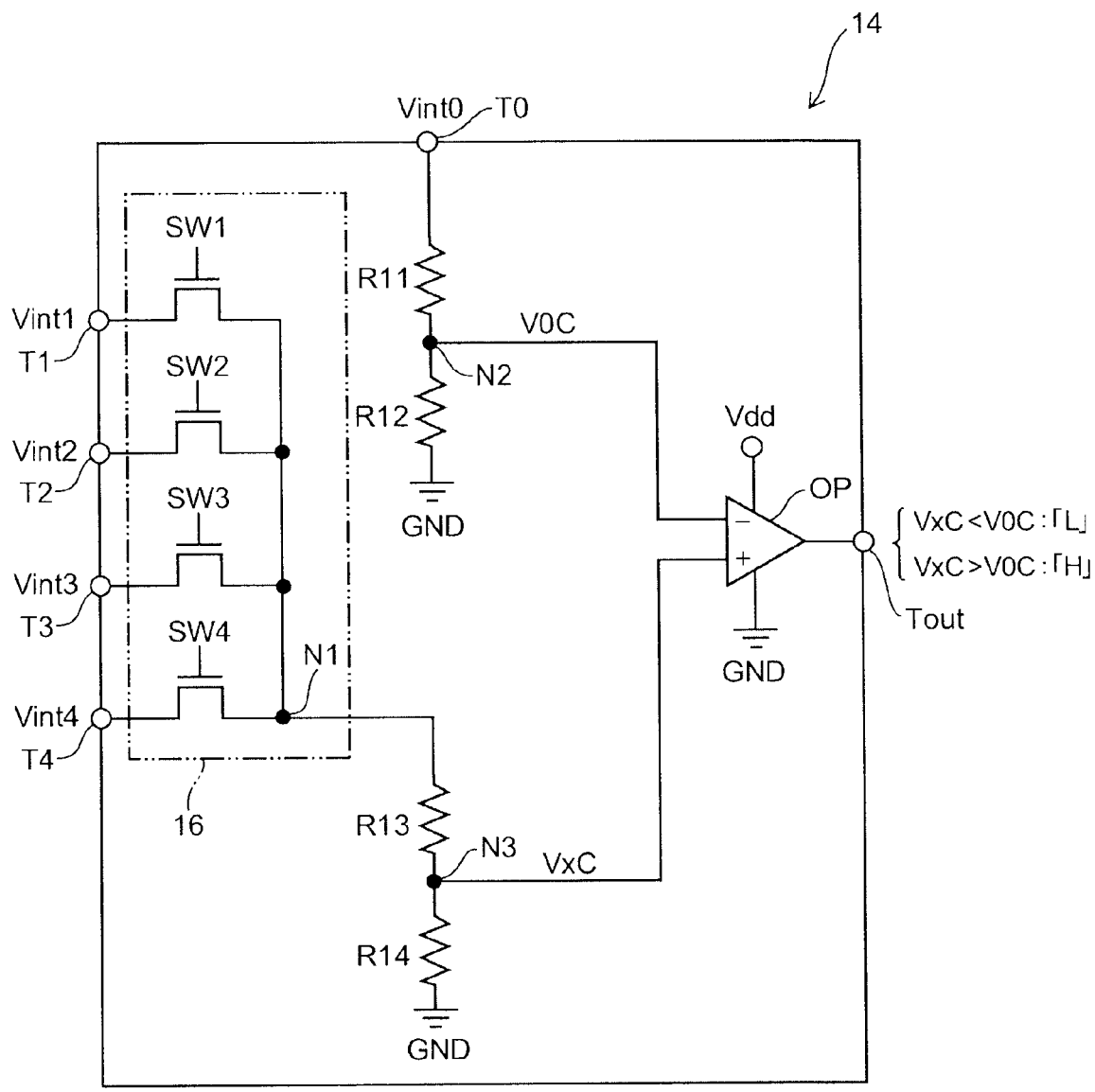
FIG. 3 is a circuit diagram illustrating an internal voltage comparison circuit of the semiconductor device according to the first embodiment.

FIG. 1 is a schematic plan view illustrating a semiconductor memory device according to this embodiment, FIG. 2 is a circuit diagram illustrating a memory cell of the semiconductor memory device according to this embodiment, FIG. 3 is a circuit diagram illustrating an internal voltage comparison circuit of the semiconductor device according to this embodiment.

The semiconductor memory device according to this embodiment is, for example, a ferroelectric memory.

As shown in FIG. 1, a ferroelectric memory 1 according to this embodiment includes a substrate 10 on which a power supply pad 11 is provided. The power supply pad 11 is a pad to which power supply potential Vdd is supplied from outside of the ferroelectric memory 1. Further, a voltage generating circuit 12 is provided on the substrate 10. The voltage generating circuit 12 is connected to the power supply pad 11. The voltage generating circuit 12 is a circuit to which the power supply potential Vdd is inputted from the power supply pad 11 and generating prescribed driving potential Vint0 on the basis of the power supply potential Vdd and ground potential GND.

Furthermore, a plurality of driving interconnections 13 are provided on the substrate 10. One end of the driving interconnections 13 is connected to the voltage generating circuit 12 and the driving potential Vint0 is applied to the end. A plurality of memory cells are connected to the driving interconnections 13. Power supplied from the voltage generating circuit 12 to the driving interconnections 13 is consumed by interconnect resistances, R1 to R5, of the driving interconnections 13 and memory cells connected to the driving interconnections 13.

As shown in FIG. 2, the semiconductor memory device according to this embodiment is the ferroelectric memory and thereby a memory cell 21 connected to the driving interconnection 13 is a ferroelectric memory cell. The memory cell 21 is connected to a bit line BL, a plate line PL and a word line WL. The memory cell 21 is, for example, a 1T1C-type ferroelectric memory cell and includes one transistor 22 and one ferroelectric capacitor 23. A gate of the transistor 22 is connected to the word line WL, one of a source and a drain is connected to the bit line BL and the other of the source and the drain is connected to one electrode of the ferroelectric capacitor 23. Moreover, the other electrode of the ferroelectric capacitor 23 is connected to the plate line PL. The above driving interconnection 13 corresponds to the bit line BL, the plate line PL or the word line WL.

Furthermore, as shown in FIG. 1, an internal voltage comparison circuit 14 is provided on the substrate 10. The internal voltage comparison circuit 14 is a circuit comparing among inputted potentials. Furthermore, an I/O pad 15 is provided on the substrate 10 and connected to the internal voltage comparison circuit 14. The I/O pad 15 is a pad for inputting/outputting data to/from the ferroelectric memory 1. An output terminal of the voltage generating circuit 12 is connected to the internal voltage comparison circuit 14 through a voltage monitoring interconnection L0.

Furthermore, voltage monitoring interconnections, L1 to L4, are connected between a portion of the driving interconnection 13 disposed at a position distant from the voltage generating circuit 12 on the substrate 10 and the internal voltage comparison circuit 14. That is, a plurality of voltage monitoring interconnections are provided and connected to portions being mutually different of the driving interconnections 13. In the example shown in FIG. 1, one end of the voltage monitoring interconnections, L1 to L4, is connected to respective portions of the driving interconnections 13 at positions, P1 to P4. The potential of the driving interconnections 13 at positions, P1 to P4, is set to be Vint1 to Vint4, respectively.

As shown in FIG. 3, the internal voltage comparison circuit 14 includes an input terminal T0. The input terminal T0 is connected to the voltage monitoring interconnection L0 so that the driving potential Vint0 is inputted from the voltage generating circuit 12 through the voltage monitoring interconnection L0. A resistance R11 and a resistance R12 are serially connected between the input terminal T0 and the ground potential GND.

The internal voltage comparison circuit 14 is provided with input terminals, T1 to T4. The input terminals, T1 to T4, are connected to other ends of the voltage monitoring interconnections, L1 to L4, respectively and the potential, Vint1 to Vint4, at the positions, P1 to P4, is inputted through the voltage monitoring interconnections, L1 to L4, thereto.

Furthermore, the internal voltage comparison circuit 14 is provided with switching elements, SW1 to SW4 and the input terminals, T1 to T4, are connected to one end of the switching elements, SW1 to SW4, respectively. The switching elements, SW1 to SW4, are illustratively composed of a MOSFET (Metal Oxide Semiconductor Field Effect Transistor), respectively. Other ends of the switching elements, SW1 to SW4, are mutually connected at a connection point N1. The switching elements, SW1 to SW4, form an interconnection selecting circuit 16 which selects one voltage monitoring interconnection from four voltage monitoring interconnections, L1 to L4. A resistance R13 and a resistance R14 are serially connected between the connection point N1 and the ground potential GND.

Furthermore, the internal voltage comparison circuit 14 is provided with an operational amplifier OP. The operational amplifier OP includes a pair of positive and negative input terminals and an output terminal, is driven by the power supply potential Vdd and the ground potential GND supplied and compares among potential inputted from two input terminals to output the comparison result from the output terminal as a signal of "H" or "L".

The negative input terminal of the operational amplifier OP is connected to a connection point N2 between the resistance R11 and the resistance R12, the positive input terminal is connected to a connection point N3 between the resistance R13 and the resistance R14 and the output terminal is connected to an output terminal Tout of the internal voltage comparison circuit 14. The operational amplifier OP outputs the signal "H" from the output terminal when potential V×C inputted from the positive input terminal is higher than potential V0C inputted from the negative input terminal, and outputs the signal "L" from the output terminal when the potential V×C is lower than the potential V0C. The output terminal Tout is connected to the I/O pad 15.

Next, operation of the semiconductor memory device according to this embodiment configured as described above is described.

As shown in FIG. 1, the power supply potential Vdd is supplied to the ferroelectric memory 1 from the outside of the ferroelectric memory 1 through the power supply pad 11. The ground potential GND is also supplied to the ferroelectric memory 1. Moreover, the voltage generating circuit 12 generates the prescribed driving potential Vint0 on the basis of the supplied power supply potential Vdd and the ground potential GND. Potential difference between the driving potential Vint0 and the ground potential GND serves as the driving voltage. The driving potential Vint0 generated by the voltage generating circuit 12 is supplied to each memory cell 21 formed on the substrate 10 through the driving interconnections 13. The operation of each memory cell is based on the supplied driving voltage.

At this time, the power transmitted through the driving interconnections 13 is consumed by interconnect resistances, R1 to R5, of the driving interconnections 13 and memory cells 21 connected to the driving interconnections 13. Accordingly, the potential of the driving interconnection 13 varies depending on a distance from the voltage generating circuit 12 and operation condition of the memory cell 21 connected to the driving interconnection 13. Normally, the potential of the driving interconnection 13 decreases with the distance from the voltage generating circuit 12. Moreover, the potential of the driving interconnection 13 decreases also in the case where most memory cells 21 connected to the driving interconnections drive in unison and the power exceeding an amount of electric power supplied by the voltage generating circuit 12 is consumed.

Thereby, the voltage generating circuit 12 generates the prescribed driving potential Vint0, but an internal voltage drop occurs due to power consumption by the interconnect resistance R1 and the memory cell 21 at the position P1 distant from the voltage generating circuit 12 and the potential of the driving interconnection 13 is to be the Vint1. Similarly, an internal voltage drop occurs due to power consumption by the interconnect resistances R2 and R5 and the memory cell 21 at the position P2 and the potential of the driving interconnection 13 is to be the Vint2. As described above, the ferroelectric memory 1 has various degrees of the internal voltage drop depending on the position inside a chip, and thus the potential of the driving interconnection 13 varies. If the potential of the driving interconnection 13 varies with the position inside the chip, the voltage applied to the memory cell 21 varies, and thus operating characteristics of the memory cells vary occasionally to reduce an operating speed.

Consequently, in fabrication of the ferroelectric memory 1, it is necessary to evaluate variations of characteristics of the memory cell like this, find failures in the case of occurrence of them, and further analyze the cause of failures. In this embodiment, the potential of the driving interconnections 13 at some positions inside the chip, namely, the positions, P1 to P4, is measured and the measurement result is utilized for the evaluation of characteristics and the analysis of the cause of failures of the ferroelectric memory 1.

As shown in FIG. 1 and FIG. 3, the potential, Vint1 to Vint4, at the positions, P1 to P4, on the substrate 10 is transmitted to the input terminals, T1 to T4, of the internal voltage comparison circuit 14 through the voltage monitoring interconnections, L1 to L4. At this time, the memory cell 21 is not connected to the voltage monitoring interconnections, L1 to L4, and the potential is only transmitted through the voltage monitoring interconnections, L1 to L4, with substantially little current, and thereby, the voltage drop due to the interconnect resistances of the voltage monitoring interconnections, L1 to L4 hardly occurs.

Only one switching element of the switching elements, SW1 to Sw4, of the internal voltage comparison circuit 14 is switched to the ON state and the others are switched to the OFF state. Thereby, the interconnection selecting circuit 16 selects one voltage monitoring interconnection of the plurality of the voltage monitoring interconnections, L1 to L4. For example, when the voltage monitoring interconnection L1 is selected, only the switching element SW1 is switched to the ON state and the switching elements, SW2 to SW4 are switched to the OFF state. Hence, the voltage monitoring interconnection L1 is selected and the voltage monitoring interconnections, L2 to L4, are not selected. As a result, the potential Vint1 at the position P1 is applied to the resistance R13 through the voltage monitoring interconnection L1, the switching element SW1 and the connection point N1.

The potential Vint1 is divided between the resistances R13 and R14 to generate the potential V×C shown in a following formula and inputted from the connection point N3 to the positive input terminal of the operational amplifier OP. Hence, the potential Vint1 is converted to the potential V×C within the operational range of the operational amplifier OP and being due to the potential Vint1, and inputted to the operational amplifier OP. Here, in the following equation (1), a resistance value of the resistance R13 is represented by "R13". Other resistances and formulae are alike.

$$V \times C = \frac{R14}{R13 + R14} \times Vint1 \qquad (1)$$

On the other hand, the driving potential Vint0 generated by the voltage generating circuit 12 is transmitted to the input terminal T0 of the internal voltage comparison circuit 14 through the voltage monitoring interconnection L0. At this time, the memory cell 21 is not connected to the voltage monitoring interconnection L0 and a current does not substantially pass through the voltage monitoring interconnection L0, hence the voltage drop due to the interconnect resistance of the voltage monitoring interconnection L0 hardly occurs. The driving potential Vint0 applied to the input terminal T0 is applied to the resistance R11 and divided by the resistances R11 and R12 to generate the potential V0C shown by the following formula (2). This potential V0C is inputted from the connection point N2 to the negative input terminal of the operational amplifier OP. Hence, the driving potential Vint0 is converted to the potential V0C within the operational range of the operational amplifier OP and being due to the driving potential Vint0, and inputted to the operational amplifier OP.

$$V0C = \frac{R12}{R11 + R12} \times Vint0 \qquad (2)$$

The operational amplifier OP compares the potential V×C inputted from the connection point N3 with the potential V0C inputted from the connection point N2, and outputs the signal "H" when the potential V×C is higher than the potential V0C and outputs the signal "L" when the potential V×C is lower than the potential V0C. This output signal is outputted from the ferroelectric memory 1 through the output terminal Tout and the I/O pad 15. As described above, by setting the resistance values of the resistances, R11 to R14, to be suitable, it is possible to detect whether potential differences between the driving potential Vint0 and the potential, Vint1 to Vint4, at each position are equal to a specified value or more or not.

Furthermore, evaluation and analysis of the ferroelectric memory 1 are carried out using this result.

Figure 4:
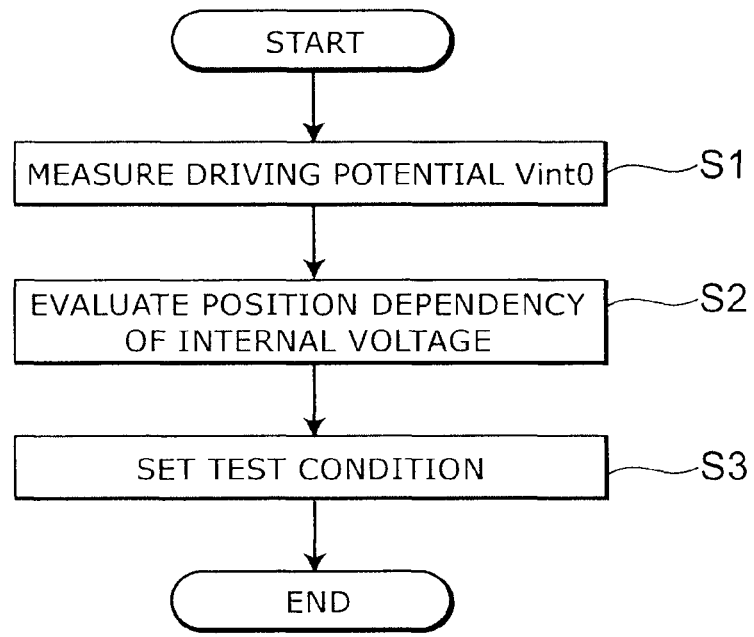
FIG. 4 is a flow chart illustrating a method for evaluation and analysis of the semiconductor memory device according to the first embodiment.

FIG. 4 is a flow chart illustrating a method for the evaluation and analysis of the semiconductor memory device according to this embodiment.

First, as shown in step S1 of FIG. 4, the driving potential Vint0 generated by the voltage generating circuit 12 is measured. Test time required for this step is short because of the only measurement of the potential.

Next, as shown in step S2, position dependency of the internal voltage in the chip is evaluated. Specifically, using the above method, the relationship between the potential, Vint1 to Vint4, at positions, P1 to P4 and the driving potential Vint0 is evaluated. The test time for this step is short, because the output signal of the internal voltage comparison circuit 14 is only monitored in a sequential ON state of the switching elements, SW1 to SW4.

Next, as shown in step S3, a test condition is determined for selecting a defective out of the ferroelectric memories 1 as products on the basis of results of steps S1 and S2. That is, a possible point of weakness is extracted from the ferroelectric memory 1 on the basis of the position dependency of the internal voltage in the chip obtained in steps S1 and S2 and a severe test condition is developed so as to reliably evaluate this point. In this step, the possible point of weakness is accurately extracted on the basis of the position dependency of the internal voltage, and thus the test condition can be accurately determined.

Next, effect of this embodiment is described.

In this embodiment, the ferroelectric memory 1 is provided with the internal voltage comparison circuit 14 and the voltage monitoring interconnections, L1 to L4, for transmitting the potential, Vint1 to Vint4, of the driving interconnections 13 at the positions, P1 to P4, in the chip to the internal voltage comparison circuit 14, and thereby the potential, Vint1 to Vint4, at the positions, P1 to P4, can be directly evaluated. At this time, the memory cell 21 is not connected to the voltage monitoring interconnections, L1 to L4 and a current does not substantially pass through the voltage monitoring interconnections, L1 to L4, hence the voltage drop due to the interconnect resistance of the voltage monitoring interconnections, L1 to L4, hardly occurs, and the precise potential, Vint1 to Vint4, can be inputted to the internal voltage comparison circuit 14.

This enables the potential, Vint1 to Vint4, to be directly measured, hence it becomes possible to evaluate the potential at each position in the chip precisely and quickly, and to comprehend the position dependency of the internal voltage of the ferroelectric memory 1. As a result, it is possible to extract accurately the possible point of weakness from the ferroelectric memory 1 and to set the severe condition capable of testing this point of weakness accurately. As described above, according to this embodiment, it is possible to realize the semiconductor memory device facilitating the evaluation and analysis.

In this embodiment, the plurality of voltage monitoring interconnections, L1 to L4, are provided and connected to mutually different positions of the driving interconnections 13. The internal voltage comparison circuit 14 is provided with the interconnection selecting circuit 16 connecting one out of the plurality of the voltage monitoring interconnections, L1 to L4, to the operational amplifier OP. This enables the potential at the plurality of positions in the chip to be sequentially evaluated.

Furthermore, in this embodiment, the output signal of the internal voltage comparison circuit 14 is outputted through the I/O pad 15. Thereby, it is possible to extract the output signal of the internal voltage comparison circuit 14 using the conventional I/O pad without providing a dedicated pad.

Next, a comparative example of this embodiment is described.

Figure 5:
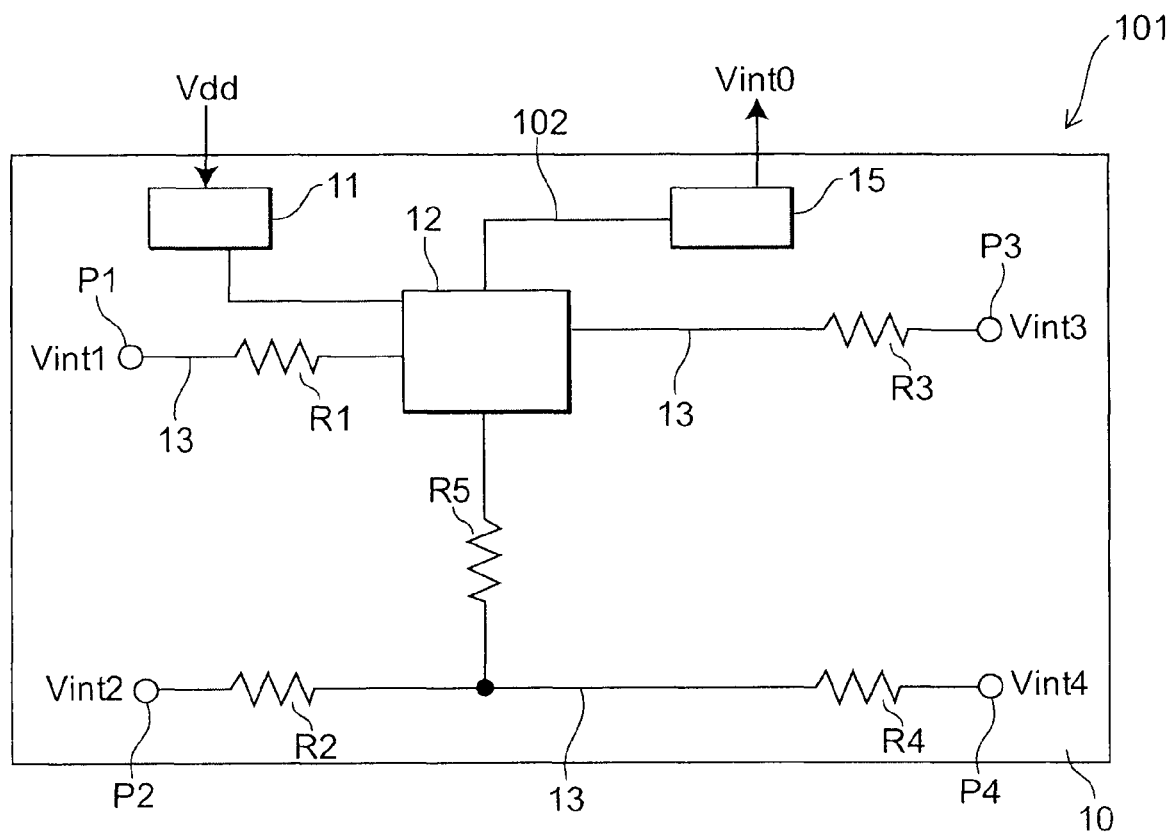
FIG. 5 is a schematic plan view illustrating a semiconductor memory device according to a comparative example.

FIG. 5 is a schematic plan view illustrating a semiconductor memory device according to a comparative example.

As shown in FIG. 5, a ferroelectric memory 101 according to this comparative example is not provided with the internal comparison circuit 14 and the voltage monitoring interconnections, L1 to L4, in comparison with the ferroelectric memory 1 (see FIG. 1) according to the first embodiment described above. Moreover, the driving potential Vint0 generated by the voltage generating circuit 12 can be outputted from the I/O pad 15 through an interconnection 102.

In the ferroelectric memory 101 according to this comparative example, similar to the first embodiment described above, the voltage generating circuit 12 generates the prescribed driving potential Vint0 on the basis of the power supply potential Vdd externally supplied through the power supply pad 11 and supplies it to each memory cell 21 through the driving interconnections 13. At this time, the power is consumed by the interconnect resistances, R1 to R5 of the driving interconnections 13 and the memory cells 21 connected to the driving interconnections 13 to reduce the potential of the driving interconnections 13.

However, the ferroelectric memory 101 can extract the driving potential Vint0 from the I/O pad 15 through the interconnection 102, but is not provided with the internal voltage comparison circuit 14 and the voltage monitoring interconnections, L1 to L4 (see FIG. 1), hence can not directly evaluate the potential, Vint1 to Vint4, of the driving interconnections 13 at each position, P1 to P4. Then, the position dependency of the internal voltage is evaluated by an indirect method.

Hereinafter, a method of evaluation and analysis of the ferroelectric memory in this comparative example is described.

Figure 6:
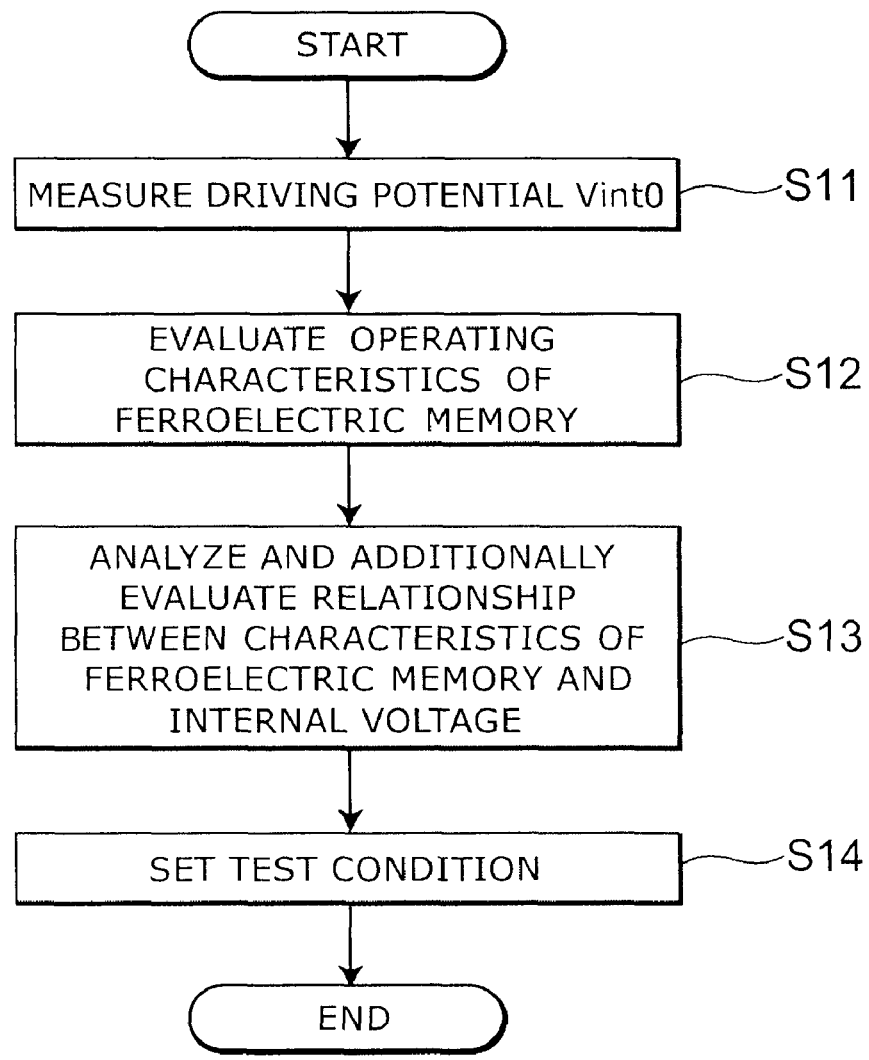
FIG. 6 is a flow chart illustrating a method for evaluation and analysis of the semiconductor memory device according to the comparative example.

FIG. 6 is a flow chart illustrating a method for evaluation and analysis of the semiconductor memory device according to the comparative example.

First, as shown in step S11 of FIG. 6, the driving potential Vint0 generated by the voltage generating circuit 12 is measured. The test time for this step is short because of the only measurement of the potential.

Next, as shown in step S12, operating characteristics of the ferroelectric memory 101 is evaluated while operating the ferroelectric memory 101 under various conditions for all intended memory cells. The test time for this step is long, because all memory cells are accessed.

Next, as shown in step S13, it is analyzed whether the operating characteristics of the ferroelectric memory 101 obtained in step S12 is caused by the variation of the internal voltage depending on the position in the chip or not, and additional evaluation is carried out as needed. For example, all memories are operated and simulation with interference is carried out. The number of tests is large and the test time for this step is also long, because all memories are accessed and various simulations are carried out. Additional evaluation increases the test time.

Next, as shown in step S14, a test condition is determined for selecting a defective out of the ferroelectric memories 101 as products on the basis of results of steps S11 to S13. However, in this comparative example, it is impossible to evaluate directly the position dependency of the internal voltage in the chip, hence it is difficult to extract accurately the possible point of weakness from the ferroelectric memory 101 and to set the test condition capable of evaluating accurately the point of weakness.

As described above, in this comparative example, it is impossible to evaluate directly the position dependency of the internal voltage in the chip, hence it is necessary to estimate the relationship between the operating characteristics of the ferroelectric memory and the position dependency of the internal voltage by an indirect method. Accordingly, a lot of time and labor are needed for preliminary tests (steps S11 to S13) for determining the test condition of products. Moreover, evaluation results obtained like this are also indirect, hence it is difficult to extract accurately the possible point of weakness from the ferroelectric memory. Therefore, it is often unsure whether the test condition determined in step S14 examines the point of weakness reliably and indeed. Consequently, the test condition becomes inevitably enormous.

Next, a second embodiment of the invention is described.

Figure 7:
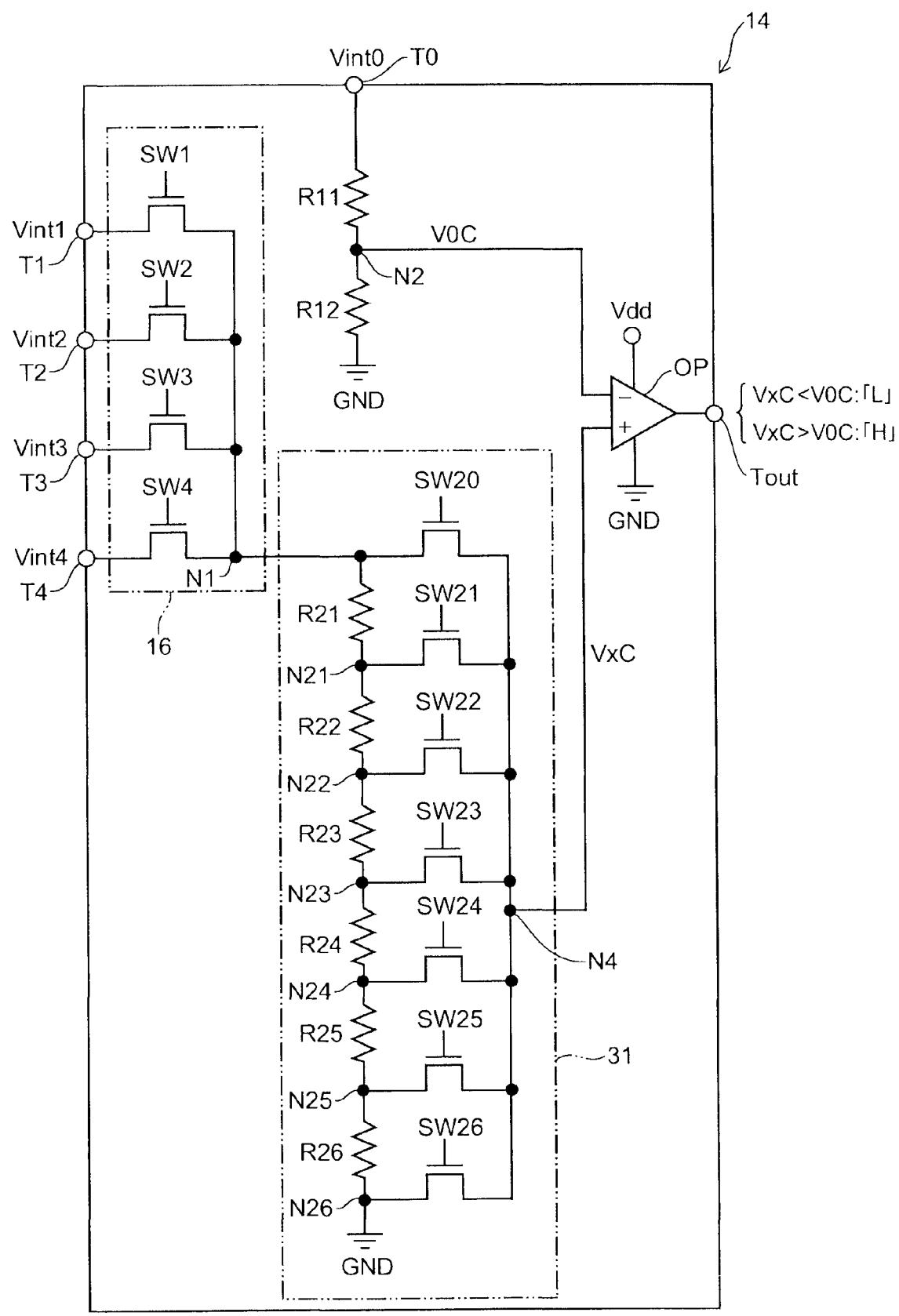
FIG. 7 is a circuit diagram illustrating an internal voltage comparison circuit of a semiconductor memory device according to a second embodiment of the invention.

FIG. 7 is a circuit diagram illustrating an internal voltage comparison circuit of a semiconductor memory device according to this embodiment.

As shown in FIG. 7, the ferroelectric memory according to this embodiment is different from the ferroelectric memory 1 (see FIGS. 1 to 3) according to the above first embodiment in that the internal voltage comparison circuit 14 is provided with a potential selecting circuit 31 in stead of the resistances R13 and R14. The configuration other than the above of this embodiment is the same as the above first embodiment.

The potential selecting circuit 31 is connected to the connection point N1, the ground potential GND and the positive input terminal of the operational amplifier OP. That is, the potential selecting circuit 31 has resistances, R21 to R26 serially connected between the connection point N1 and the ground potential GND. Moreover, a switching element SW20 is connected between the connection point N1 and a connection point N4 connected to the positive input terminal of the operational amplifier OP. Switching elements, SW21 to SW25, are connected between the connection point N4 and each of a connection point N21 between the resistance R21 and the resistance R22, a connection point N22 between the resistance R22 and the resistance R23, a connection point N23 between the resistance R23 and the resistance R24, a connection point N24 between the resistance R24 and the resistance R25 and a connection point N25 between the resistance R25 and the resistance R26. Furthermore, a switching element SW26 is connected between the connection point N4 and the connection point N26 between the resistance R26 and the ground potential GND. The switching elements, SW20 to SW26 are illustratively MOSFETs.

Next, the operation and effect of this embodiment are described.

Also in this embodiment, similar to the above first embodiment, the potential V0C inputted to the negative input terminal of the operational amplifier OP is a characteristic value obtained by dividing the driving potential Vint0 by the resistances R1 and R2, that is, a value expressed by the formula (2).

On the other hand, the potential V×C inputted to the positive input terminal of the operational amplifier OP is also potential obtained by dividing one potential selected from the potential, Vint1 to Vint4, by resistances, similar to the first embodiment, but in this embodiment, a dividing ratio by resistances can be controlled.

More specifically, the dividing ratio by resistances can be selected by switching only one switching element of switching elements, SW20 to SW 26, to the On state and others to the OFF state, even if the same potential is applied to the connection point N1, the value of the potential V×C can be varied. For example, if the switching element SW1 is in the ON state, and the switching elements, SW2, W3, SW4 are in the OFF state, the potential at the connection point N1 turns to the potential Vint1. If the only switching element SW23 is switched to the ON state and the remaining switching elements are into the OFF state under this condition, the potential V×C turns to the value expressed by the following formulae (3) and (4).

$$V \times C = \frac{R24 + R25 + R26}{RA1} \times Vint1 \quad (3)$$

$$RA1 = R21 + R22 + R23 + R24 + R25 + R26 \quad (4)$$

Moreover, if only the switching element SW22 is switched to the ON state and the others are to the OFF state, the potential V×C turns to the value expressed by the following formula (5).

$$V \times C = \frac{R23 + R24 + R25 + R26}{RA1} \times Vint1 \quad (5)$$

The output signal of the operational amplifier OP is "H" in the case of V×C>V0C, and "L" in the case of V0C>V×C. Hence, if any one of the switching elements, SW20 to SW26, is switched to the ON state, when V×C is varied, determination of the range of the potential to be measured (for example, potential Vint1) depends on which switching element switched to the ON state switches over the output result of the operational amplifier OP.

For example, in the example described above, if the output signal of the operational amplifier OP is "L" when the switching element SW23 is switched to the ON state, and the output signal of the operational amplifier OP is "H" when the switching element SW22 is switched to the ON state, it is known that the potential Vint1 is within a range expressed by the following formula (6).

$$\frac{RA1}{R23 + R24 + R25 + R26} \times \frac{R12}{R11 + R12} \times Vint0 < \quad (6)$$

$$Vint1 < \frac{RA1}{R24 + R25 + R26} \times \frac{R12}{R11 + R12} \times Vint0$$

The operation and effects other than the above of this embodiment are the same as the above first embodiment.

Next, a third embodiment of the invention is described.

Figure 8:
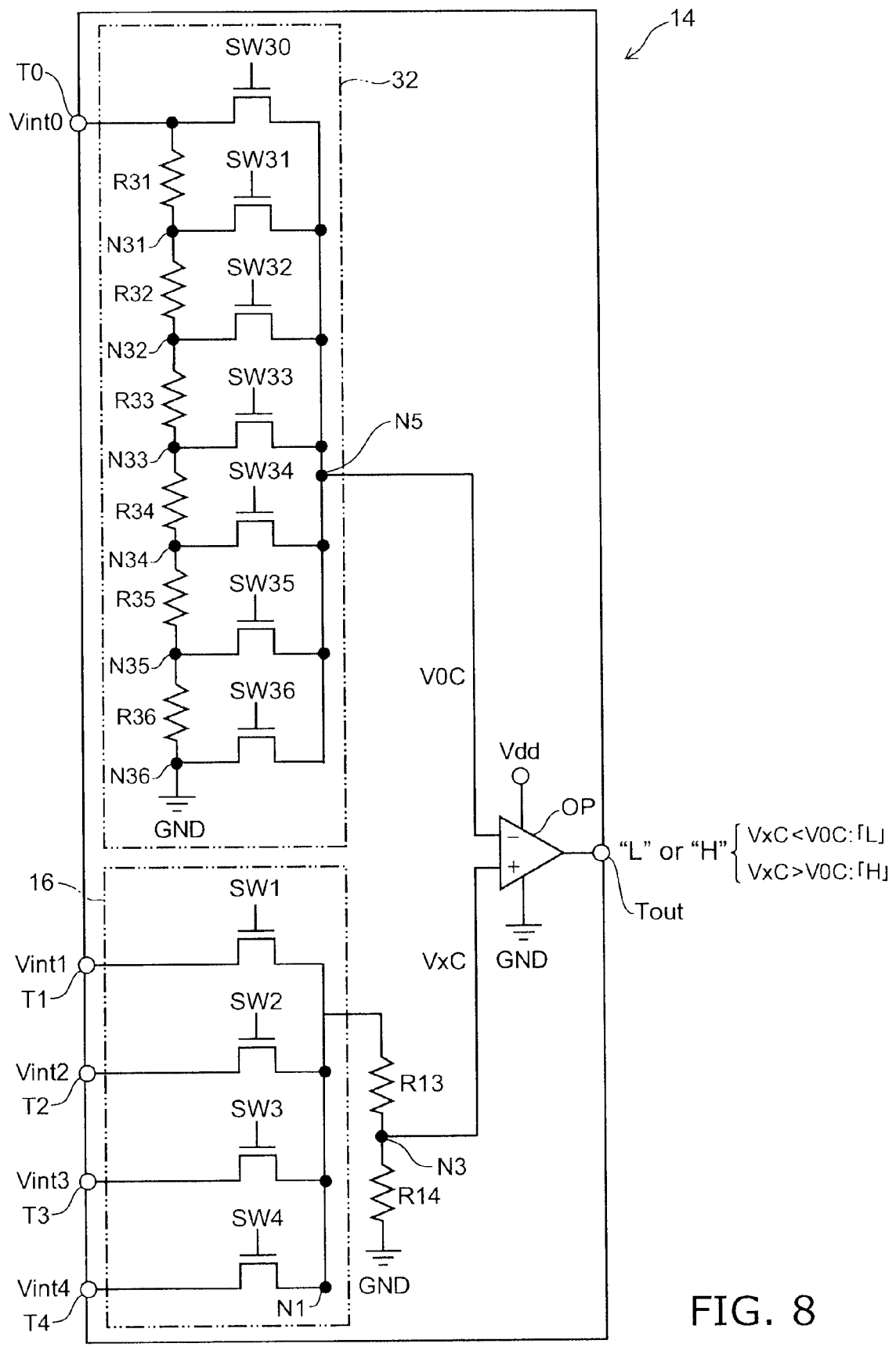
FIG. 8 is a circuit diagram illustrating an internal voltage comparison circuit of a semiconductor memory device according to a third embodiment of the invention.

FIG. 8 is a circuit diagram illustrating an internal voltage comparison circuit of a semiconductor memory device according to this embodiment.

As shown in FIG. 8, the ferroelectric memory according to this embodiment is different from the ferroelectric memory 1 (see FIG. 1 to FIG. 3) according to the above first embodiment in that the internal voltage comparison circuit 14 is provided with a potential selecting circuit 32 in stead of the resistances R11 and R12. The configuration other than the above of this embodiment is the same as the above first embodiment.

The potential selecting circuit 32 is connected to the input terminal T0 of the internal voltage comparison circuit 14, the ground potential GND and the negative terminal of the operational amplifier OP. That is, the potential selecting circuit 32 has resistances, R31 to R36, serially connected between the input terminal T0 and the ground potential GND. Moreover, a switching element SW30 is connected between the input terminal T0 and a connection point N5 connected to the negative input terminal of the operational amplifier OP. Switching elements, SW31 to SW35, are connected between the connection point N5 and each of a connection point N31 between the resistance R31 and the resistance R32, a connection point N32 between the resistance R32 and the resistance R33, a connection point N33 between the resistance R33 and the resistance R34, a connection point N34 between the resistance R34 and the resistance R35 and a connection point N35 between the resistance R35 and the resistance R36. Furthermore, a switching element SW36 is connected between the connection point N5 and the connection point N36 between the resistance R36 and the ground potential GND. The switching elements, SW30 to SW36 are illustratively MOSFETs.

Next, the operation and effect of this embodiment are described.

In this embodiment, providing the potential selecting circuit 32 allows a resistance division ratio to be varied in converting the driving potential Vint0 to the potential V0C. On the other hand, a resistance division ratio is constant in converting one potential selected from the potential, Vint1 to Vint4, to the potential V×C.

More specifically, the dividing ratio by resistances can be selected by switching only one switching element of switching elements, SW30 to SW36, to the On state and others to the OFF state, and the value of the potential V0C can be varied. For example, if only the switching element SW33 is in the ON state, and the remaining switching elements are in the OFF state, the potential V0C turns to the value expressed by the following formulae (7) and (8).

$$V0C = \frac{R34 + R35 + R36}{RA2} \times Vint0 \quad (7)$$

$$RA2 = R31 + R32 + R33 + R34 + R35 + R36 \quad (8)$$

Moreover, if only the switching element SW23 is switched to the ON state, and other switching elements are switched to the OFF state, the potential V0C turns to a value expressed by the following formula (9).

$$V0C = \frac{R33 + R34 + R35 + R36}{RA2} \times Vint0 \quad (9)$$

Thus, if any one of the switching elements, SW30 to SW36, is switched to the ON state, when V0C is varied, determination of the range of the potential to be measured (for example, potential Vint1) depends on which switching element switched to the ON state switches over the output result of the operational amplifier OP.

For example, in the case of selecting the potential Vint1 as an evaluation object, if the output signal of the operational amplifier OP is "H" when the switching element SW33 is switched to the ON state, and the output signal of the operational amplifier OP is "L" when the switching element SW32 is switched to the ON state, it is known that the potential Vint1 is within a range expressed by the following formula (10).

$$\frac{R34+R35+R36}{RA2} \times \frac{R13+R14}{R14} \times Vint0 < \quad (10)$$

$$Vint1 < \frac{R33+R34+R35+R36}{RA2} \times \frac{R13+R14}{R14} \times Vint0$$

The operation and effect other than the above of this embodiment is the same as the above first embodiment.

The invention has been described with reference to the embodiments. However, the invention is not limited to these embodiments. For example, any addition, deletion, or design change of components, or any addition, omission, or condition change of processes in the above embodiments suitably made by those skilled in the art are also encompassed within the scope of the invention as long as they fall within the spirit of the invention. In the above embodiments, the ferroelectric memory is exemplified as the semiconductor memory device, however, the invention is not limited thereto. A semiconductor memory device provided with a plurality of memory cells on a substrate is preferably applicable.

The invention claimed is:

1. A semiconductor memory device comprising:
    a substrate;
    a voltage generating circuit provided on the substrate and configured to generate prescribed driving potential;
    a driving interconnection provided on the substrate and to which the driving potential is applied;
    a plurality of memory cells connected to the driving interconnections;
    an internal voltage comparison circuit configured to compare inputted potentials and to output results thereof; and
    a voltage monitoring interconnection connected between a portion of the driving interconnection disposed at a position distant from the voltage generating circuit on the substrate and the internal voltage comparison circuit,
    the internal voltage comparison circuit comparing potential inputted through the voltage monitoring interconnection with the driving potential.

2. The memory device according to claim 1, wherein
    a plurality of the voltage monitoring interconnections are provided, and
    the plurality of the voltage monitoring interconnections are connected to portions being mutually different of the driving interconnections,
    the internal voltage comparison circuit including:
        an interconnection selecting circuit configured to select one from the plurality of the voltage monitoring interconnections; and
        an operational amplifier configured to compare potential due to potential of the one voltage monitoring interconnections selected by the interconnection selecting circuit with potential due to the driving potential.

3. The memory device according to claim 2, wherein
    the interconnection selecting circuit includes a plurality of switching elements having one end connected to each of the voltage monitoring interconnections and another end commonly connected.

4. The memory device according to claim 3, wherein
    the switching elements are MOSFETs.

5. The memory device according to claim 2, wherein
    the internal voltage comparison circuit further includes two resistances serially connected between the driving potential and reference potential,
    a connection point between the two resistances is connected to an input terminal of the operational amplifier.

6. The memory device according to claim 2, wherein
    the internal voltage comparison circuit further includes two resistances serially connected between the selected one voltage monitoring interconnection and reference potential,
    a connection point between the two resistances is connected to an input terminal of the operational amplifier.

7. The memory device according to claim 1, wherein
    the internal voltage comparison circuit includes:
        a potential selecting circuit configured to generate potential with a plurality of levels based on potential of the voltage monitoring interconnection; and
        an operational amplifier configured to compare potential generated by the potential selecting circuit and potential due to the driving potential.

8. The memory device according to claim 7, wherein
    the potential selecting circuit includes:
        a plurality of resistances serially connected between the voltage monitoring interconnection and reference potential; and
        a plurality of switching elements having one end connected to a connection point between two resistances of the plurality of resistances and another end commonly connected to an input terminal of the operational amplifier.

9. The memory device according to claim 8, wherein
    the switching elements are MOSFETs.

10. The memory device according to claim 7, wherein
    a plurality of the voltage monitoring interconnections are provided, and
    the plurality of the voltage monitoring interconnections are connected to portions being mutually different of the driving interconnections,
    the internal voltage comparison circuit further including an interconnection selecting circuit configured to select one from the plurality of the voltage monitoring interconnections to connect to the potential selecting circuit.

11. The memory device according to claim 10, wherein
    the interconnection selecting circuit includes a plurality of switching elements having one end connected to each of the voltage monitoring interconnections and another end commonly connected to the potential selecting circuit.

12. The memory device according to claim 7, wherein
    the internal voltage comparison circuit further includes two resistances serially connected between the driving potential and reference potential,
    a connection point between the two resistances is connected to an input terminal of the operational amplifier.

13. The memory device according to claim 1, wherein
    the internal voltage comparison circuit includes:
        a potential selecting circuit configured to generate potential with a plurality of levels based on the driving potential; and
        an operational amplifier configured to compare potential due to potential of the voltage monitoring interconnection and potential generated by the potential selecting circuit.

14. The memory device according to claim 13, wherein
    the potential selecting circuit includes:
        a plurality of resistances serially connected between the driving potential and reference potential; and
        a plurality of switching elements having one end connected to a connection point between two resistances of the plurality of resistances and another end commonly connected to an input terminal of the operational amplifier.

15. The memory device according to claim 14, wherein the switching elements are MOSFETs.

16. The memory device according to claim 13, wherein
a plurality of the voltage monitoring interconnections are provided, and
the plurality of the voltage monitoring interconnections are connected to portions being mutually different of the driving interconnections,
the internal voltage comparison circuit further includes an interconnection selecting circuit configured to select one from the plurality of the voltage monitoring interconnections.

17. The memory device according to claim 16, wherein
the interconnection selecting circuit includes a plurality of switching elements having one end connected to each of the voltage monitoring interconnections and another end commonly connected.

18. The memory device according to claim 16, wherein
the internal voltage comparison circuit further includes
 two resistances serially connected between the selected one voltage monitoring interconnection and reference potential,
a connection point between the two resistances is connected to an input terminal of the operational amplifier.

19. The memory device according to claim 1, wherein
the memory cell is a ferroelectric memory cell, and the driving interconnection is one of a bit line, a plate line and a word line.

20. The memory device according to claim 1, further comprising:
a voltage pad provided on the substrate and connected to the voltage generating circuit; and
an I/O pad provided on the substrate and connected to an output terminal of the internal voltage comparison circuit.

* * * * *